United States Patent [19]
Kelly

[11] Patent Number: 5,942,886
[45] Date of Patent: Aug. 24, 1999

[54] POWER DEVICE WITH A SHORT-CIRCUIT DETECTOR

[75] Inventor: Brendan P. Kelly, Stockport, United Kingdom

[73] Assignee: U.S. Philips Corporation, New York, N.Y.

[21] Appl. No.: 09/025,370

[22] Filed: Feb. 18, 1998

[30] Foreign Application Priority Data

Feb. 19, 1997 [GB] United Kingdom .................... 9703453
Aug. 8, 1997 [GB] United Kingdom .................... 9716839

[51] Int. Cl.$^6$ ................................. G05F 3/04; H02H 7/00
[52] U.S. Cl. .............................................. 323/312; 361/18
[58] Field of Search ...................................... 323/271, 312, 323/313; 361/18

[56] References Cited

U.S. PATENT DOCUMENTS

| | | | |
|---|---|---|---|
| 4,929,884 | 5/1990 | Bird et al. ................................. | 323/313 |
| 5,086,364 | 2/1992 | Leipold et al. ............................ | 361/18 |
| 5,570,255 | 10/1996 | Hirata ........................................ | 361/18 |
| 5,670,867 | 9/1997 | Mitsuda .................................... | 323/312 |
| 5,793,596 | 8/1998 | Jordan et al. .............................. | 361/18 |
| 5,844,760 | 12/1998 | Kumagai et al. .......................... | 361/18 |

*Primary Examiner*—Stuart N. Hecker
*Attorney, Agent, or Firm*—Steven R. Biren

[57] ABSTRACT

A power device circuit comprises a power semiconductor device (MPWR) in series with a load (LD) between a power supply line (1) and a return line (2), and a short-circuit detector (R1, R2, . . . R1', R2', . . . CP) for determining whether the load (LD) is short-circuit. The short-circuit detector examines the distribution of the supply-to-return voltage (Vbg) between the device (MPWR) and the load (LD) by comprising a comparator (CP) which has a first input (+) coupled to a series node (11) between the device and load and a second input (+) from circuit means (R1, R2, . . . , R1', R2', . . . ) coupled between the supply and return lines (1 and 2) to provide the second input (−) with a voltage supply signal (Vbg') which is a predetermined function of the supply-to-return voltage (Vbg). By so comparing the voltage (Vdl) at the series node (11) with the predetermined function of the supply-to-return voltage (Vbg), the detector (SC) provides an output signal (sc) indicating whether or not a short-circuit is present. Preferably pinch-resistors (R1,R2) or a voltage-clamp (ZD) are used with the circuit means (R1, R2, . . . , R1', R2', . . . ), so that the predetermined function of the supply-to-return voltage (Vbg) input to the comparator (CP) varies with the magnitude of the supply-to-return voltage (Vbg). By this means a lower percentage of the supply-to-return voltage (Vbg) can be input at a higher magnitude of the supply-to-return voltage (Vbg) than at a lower magnitude.

9 Claims, 6 Drawing Sheets

POWER DEVICE WITH A SHORT-CIRCUIT DETECTOR

BACKGROUND OF THE INVENTION

This invention relates to a power device circuit, for example for automotive switching applications, comprising a power semiconductor device with a short-circuit detector. The power semiconductor device may be, for example, an insulated-gate field-effect transistor (hereinafter termed "MOSFET"), an insulated-gate bipolar transistor (hereinafter termed "IGBT"), or a bipolar transistor. The detector serves for determining whether the device load is short-circuited, e.g. whether or not most of a supply-to-return voltage is directly across the power semiconductor device when, for example, a lamp or bulb operated by the device has blown into a short-circuit condition.

Two main approaches have been previously proposed for short-circuit detection, both of which involve a load voltage detector which is enabled some time, e.g. 150 µs, after the power semiconductor device MPWR is turned on. these two approaches are illustrated as FIGS. 7a and 7b, in which the circuit block SC' denotes the short-circuit detector.

(a) Vbl(to) detector (FIG. 7a)

In this scheme the voltage drop Vbl across the power device MPWR, between a battery supply line 1 and load terminal 11, is compared with a constant threshold voltage Vbl(to) from a reference circuit REF. In a typical 12 volt automotive system, Vbl(to) might be set to around 6 to 10 volts. If the voltage drop Vbl falls and remains below Vbl(to) then the load $R_L$ is considered normal, whereas if the voltage drop Vbl exceeds Vbl(to) then the load $R_L$ is considered to represent a short circuit. The load resistance which represents the transition between normal and short circuit is given by:

$$Rload=(Vbg-Vbl(to))/Iload$$

where Iload is the output current of the high-side power device MPWR and where Vbg is the battery to ground voltage between battery supply line 1 and return line 2.

There are problems with this approach:

(i) The "short circuit" load resistance is a strong function of battery voltage Vbg and power device output current Iload, whereas the end user's idea of a short circuit is more likely to be a constant value of Rload (e.g 10 mOhm).

(ii) For low battery voltages, where Vbg<Vbl(to), there can be no detection of "short circuit" conditions. Therefore the diagnostic feature is inoperative and other protection features such as over-temperature shutdown must be relied on. The device MPWR may continue dissipating large amounts of power for a considerable time causing an unacceptable temperature rise in the overall system or module.

(iii) Simplest detectors SC of this form use avalanche diodes to determine the Vbl(to) value, but these diodes tend to have significant process variation in initial avalanche voltage and they suffer from degradation during operation. This circuit requires some physical generation of a threshold voltage Vbl(to).

(b) Vlg(to) detector (FIG. 7b)

In this scheme the load to ground line voltage Vlg, i.e. the voltage applied across the load $R_L$, is compared with a constant threshold voltage Vlg(to). In a typical 12 volt automotive system, Vbl(to) might be set to around 2 to 6 volts. If the voltage Vlg across the load $R_L$ rises and remains above Vlg(to) then the load is considered normal whereas if the voltage Vlg across the load $R_L$ is less than Vlg(to) then the load $R_L$ is considered to be a short circuit. The load resistance which represents the transition between normal and short circuit is given by:

$$Rload=Vlg(to)/Iload$$

There are problems with this approach:

(i) For low battery to ground voltages, when Vbg<Vlg (to), then the load is always determined as a short circuit condition, regardless of its real nature. Useful Vlg(to) values for normal operating conditions tend to preclude proper low battery voltage functionality.

(ii) For higher battery voltages Vbg, very high power dissipation may occur without being detected as a short circuit if a few volts are developed across the load $R_L$. In this case other protection features such as over-temperature shutdown must be relied on. The device MPWR may continue dissipating large amounts of power for a considerable time, causing an unacceptable temperature rise in the overall system or module.

(iii) Again a physical voltage threshold is required.

United States Patent specification U.S. Pat. No. 4,929,884 (our reference PHB 33363) discloses various monitor and/or protective circuits for power semiconductor devices, for example temperature-sensing circuits and a short-circuit detector circuit. The whole contents of U.S. Pat. No. 4,929,884 are hereby incorporated herein as reference material. In particular, U.S. Pat. No. 4,929,884 discloses a short-circuit detector circuit comprising (in FIG. 11 of U.S. Pat. No. 4,929,884) a potential divider of two resistances connected between the load and ground terminals. The output of the divider is fed to a current mirror and processed to provide a turn-off signal to the power semiconductor device in the event of this output being low (instead of a high voltage across the load) when the power device is on. The short-circuit detector of U.S. Pat. No. 4,929,884 is a particular form of the second approach illustrated in the present FIG. 7b. The threshold voltage Vlg(to) in this FIG. 11 circuit is physically determined by the divide ratio (RD20+RD21)/RD21 multiplied by the Vgs threshold of T117. The Vgs threshold of T117 also depends on the mirror ratio of the current mirror 402, the value of Vlow at terminal 116 and also RD23, and the threshold of the following T119–T120 inverter. Thus, the threshold voltage Vlg(to) in this FIG. 11 circuit of U.S. Pat. No. 4,929,884 is dependent on several factors which are process dependent, especially the Vgs threshold of T117 and the resistance value of RD23.

It is an aim of the present invention to provide a power semiconductor device with a short-circuit detector based on a new approach which avoids or mitigates at least most of the disadvantages of the two previous main approaches as described with reference to the present FIGS. 7a and 7b.

SUMMARY OF THE INVENTION

According to the present invention, there is provided a power device circuit comprising a power semiconductor device in series with a load between a power supply line and a return line, and a short-circuit detector for determining whether the load is short-circuit, a supply-to-return voltage being applied between the supply and return lines in operation of the circuit, wherein the short-circuit detector examines the distribution of the supply-to-return voltage between the device and the load by comprising a comparator which has a first input coupled to a series node between the device and load and a second input from circuit means coupled between the supply and return lines to provide the second input with a voltage supply signal which is a predetermined function of the supply-to-return voltage, and so comparing the voltage at the series node with the predetermined function of the supply-to-return voltage to provide an output signal indicating whether or not a short-circuit is present.

The present invention provides a new approach to short-circuit detection which examines the distribution of the supply-to-return voltage between the device and the load and so eliminates the need for generating an absolute threshold comparison voltage, thereby improving the precision and long term stability of the detector. Thus, unlike the previous proposals of FIGS. 7a and 7b, there is no comparison against an independent physically determined voltage. Instead in accordance with the invention, there is a simple comparison of the series node voltage with a predetermined function of the applied voltage. Unlike the FIG. 7a circuit, the circuit in accordance with the invention is able to indicate a short circuit load even for very low supply voltages. Unlike the FIG. 7b circuit, the circuit in accordance with the invention is able also to allow proper operation at very low supply voltages with normal loads.

The invention is particularly useful for coping with the type of battery conditions and short-circuits that can occur in automotive switching applications. Thus, the voltage supply may be from a battery, for example a vehicle battery in an automotive circuit, which is coupled to a high voltage supply line in the circuit. The return line at a reference potential is usually designated as the "ground" line, but it may actually be at a bias level with respect to ground, as known in, for example, an automotive circuit. So as to simplify the subsequent discussion, the supply-to-return voltage is herein designated as "Vbg", and the voltage at the series node between the power semiconductor device and the load is designated "Vdl".

In a particularly advantageous and preferred form in accordance with the invention, the predetermined function of Vbg derived by the circuit means varies with the magnitude of Vbg so as to input a lower percentage of Vbg to the comparator at a higher magnitude of Vbg than at a lower magnitude of Vbg. This provides a variable detection threshold for Vdl as a function of Vbg. Unlike FIG. 7b, the maximum allowed voltage across the power device (and so the power dissipation in the power device) with this type of circuit in accordance with the invention does not continue to rise steeply at higher Vbg values, but instead it can be designed to level off at a tolerable safe value. Pinch resistors and/or zener diodes can be used to limit or clamp the voltage. When the comparator inputs are taken from one or more resistance dividers, the divider ratios can be modified by voltage limiting/clamping to achieve reliable and safe detection and protection from short circuit loads across a full range of Vbg values, for example battery voltages from 5 to 50 volts.

Thus, in accordance with a further aspect of the present invention, there is provided a power device circuit comprising a power semiconductor device and a detector for determining whether the device load is short-circuit, wherein the short-circuit detector examines the distribution of Vbg between the device and the load by comparing Vbl with a predetermined function of the Vbg, in which the percentage of Vbg which is input to the comparator is lower at higher Vbg than at lower Vbg.

As regards the provision of a voltage supply signal by circuit means coupled between the supply and return lines, the magnitude of this voltage supply signal is generally less than that of Vbg. Thus, the magnitude of this voltage supply signal is more compatible than Vbg for supply to a comparator input, for comparison with a voltage signal derived from the power semiconductor device and/or its load. As described below, various functions of Vbg may be derived by appropriate use of known configurations of circuit elements.

The circuit means which provides a voltage supply signal as a predetermined function of Vbg may comprise a resistance divider having first and second resistors coupled in series between the power supply line and the return line. A series node between the first and second resistors may be coupled to the second input of the comparator to provide the predetermined fraction of Vbg. The first input of the comparator may be taken directly from the series node of the device and load. This provides a very simple circuit. However the design of a high performance circuit is facilitated if the first input of the comparator is also taken from a resistance divider. Thus, for example, the circuit means which derives the voltage supply signal as a predetermined function of Vbg may comprise a resistance divider network having two parallel arms, a first arm comprising first and second resistors to provide the predetermined fraction of Vbg, and a second arm comprising third and fourth resistors coupled in series between the power supply line and the series node of the device and load, a series node between the third and fourth resistors being coupled to the first input of the comparator.

Thus, the short-circuit detector in accordance with the present invention may comprise a resistance divider and/or resistance network of pinch resistors having a resistance value which increases with voltage, whereby a lower voltage fraction is input to the comparator at higher voltage values than at lower voltage values. When the power semiconductor device is a MOSFET or IGBT formed using DMOS technology, these pinch resistors may be formed readily using the low-doped transistor-body doping stage. Each pinch resistor may comprise a semiconductor resistance region of one conductivity type which is depleted by a depletion layer at a p-n junction with a region of the opposite conductivity type and/or by a depletion layer from below an overlying plate.

The short-circuit detector may comprise voltage-to-current converters in first and second parallel arms of, for example, a current-mirror comparator. The first arm may be coupled between the power supply line and the return line and may include a resistance divider of first and second resistors. The second arm may be coupled between the power supply line and the series node of the device and load. A voltage limiter, for example a zener, may be coupled to a series node between the first and second resistors so that the predetermined function of Vbg which is input to the comparator is clamped (or otherwise limited) at higher Vbg.

The short-circuit detector may comprise divider and/or network circuits which have enablable isolation switches coupling the divider and/or network to the comparator and to the supply line and/or return line. Alternatively the supply line to which the network is connected could itself be switchable, and the comparator could have isolating inputs.

The circuit features in accordance with the present invention, as well as additional circuit functions (if so desired) and their device features may be integrated with the power device using known integration and circuit techniques such as described in, for example, U.S. Pat. No. 4,929,884 and U.S. Pat. No. 5,563,760 and/or with novel integrated device structures and techniques as disclosed herein. Thus, both United States patent specifications U.S. Pat. No. 4,929,884 and U.S. Pat. No. 5,563,760 disclose various monitor and/or protective circuits which are advantageous for such power semiconductor devices. The whole contents of U.S. Pat. No. 5,563,760 (our reference PHB 33667) are hereby incorporated herein as reference material.

BRIEF DESCRIPTION OF THE DRAWING

These and other features in accordance with the present invention, are illustrated specifically in embodiments of the invention now to be described, by way of example, with reference to the accompanying diagrammatic drawings, in which.

Figure 1:
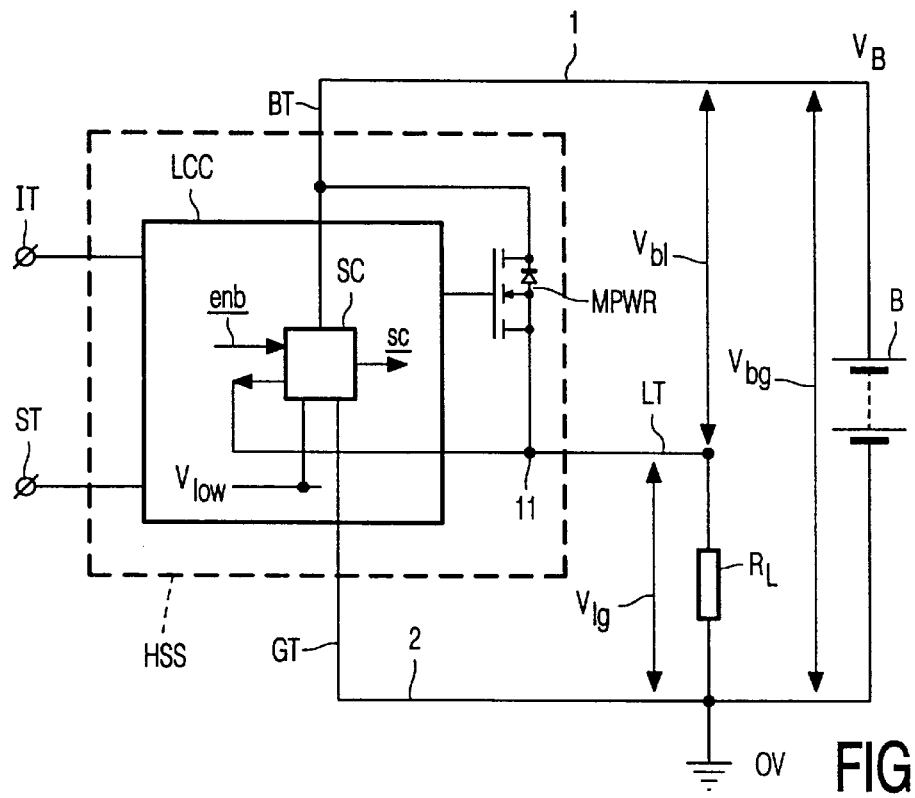
FIG. 1 is a block diagram of one embodiment of a power device circuit in accordance with the present invention.

It should be noted that the drawings are diagrammatic and not drawn to scale. Relative dimensions and proportions of the device parts of FIGS. 6a to 6f have been shown exaggerated or reduced in size, for the sake of clarity and convenience in the drawings.

DESCRIPTION OF THE PREFERRED EMBODIMENTS

The power device circuit of FIG. 1 comprises a power semiconductor device MPWR in series with a load $R_L$ between a power supply line 1 and ground. The supply may be from a battery B, for example a vehicle battery in an automotive circuit, which is coupled between the supply line 1 and ground. The ground in the circuit is a reference potential (OV) on a return line 2. The device MPWR, for example a MOSFET or IGBT, may be a switch in an automotive circuit. The load $R_L$ may be, for example, a lamp in the automotive circuit. In the circuit of FIG. 1, the load $R_L$ is coupled between an output (load terminal LT) of the device MPWR and the return line 2. Thus, the device MPWR of the FIG. 1 circuit is a so-called "high-side switch" HSS, being located on the high voltage side ($V_B$) of the load $R_L$, rather than on the ground side (OV). The expressions "supply-to-ground voltage" Vbg, "supply-to-load voltage" Vbl and "load-to-ground voltage" Vlg refer to the voltages between the respective nodes shown in the FIG. 1 circuit.

Integrated with the power semiconductor device MPWR is a semiconductor logic control circuit LCC for controlling the switching of the device MPWR. The control circuit LCC is included in the device package of the device MPWR, as indicated by its inclusion within the outline HSS in FIG. 1. The HSS package is of a known 5-terminal type having a supply terminal BT and a load terminal LT which are coupled to the main electrodes of the power device MPWR, an input terminal IT coupled to the control electrode of the power device MPWR by the circuit LCC, a ground terminal GT, and an (optional) status terminal ST indicating the operational status of the power device MPWR. The control circuit LCC can be integrated monolithically with the device MPWR in, for example, the advantageous manner disclosed in U.S. Pat. No. 4,929,884. In this case, the low voltage semiconductor components of the control circuit LCC can be operated from a low voltage supply Vlow which is generated in the HSS and regulated with respect to the high voltage supply terminal BT coupled to the line 1.

The control circuit LCC includes a short-circuit detector SC in accordance with the present invention, as well as including known monitor and protective circuits for, for example, temperature sensing. The short-circuit detector SC determines whether the load is short-circuit, e.g. whether or not most of the supply-to-ground voltage Vbg is directly across the power semiconductor device MPWR when, for example, load $R_L$ operated by the device MPWR has blown into a short-circuit condition. An output signal sc of the detector SC is used in known manner by the control circuit LCC to control the operation of the device MPWR and to give an appropriate status signal at the status terminal ST. The detector SC can be enabled by an enable signal enb logically derived in the control circuit LCC in known manner from signals at the input terminal IT and at internal nodes of the control circuit LCC.

In accordance with the present invention, the short-circuit detector SC of FIG. 1 examines the distribution of Vbg between the device MPWR and the load $R_L$ by circuit means (R1, R2, ..., R1',R2', ... see FIGS. 2 and 4) which is coupled between the supply and return lines 1 and 2 to derive a voltage supply signal as a predetermined function of Vbg, and by a comparator (CP, see FIGS. 2 and 4) which has a first input (+) coupled to a series node 11 between the device MPWR and load $R_L$ and a second input (−) coupled to the circuit means (R1, R2, ..., R1', R2', ... ). In this way the voltage Vbl between the supply line 1 and load $R_L$ is compared with the predetermined function of Vbg and so to provide the output signal sc indicating whether or not a short-circuit is present. This circuit is a novel approach to attempting to determine, some time after turn-on, whether the switch HSS has managed to drive a given load $R_L$ or whether the load $R_L$ should be considered as a "short circuit load". In the latter case the power device MPWR may be quickly turned off, to reduce thermal stress and/or a diagnostic signal may be issued to warn the application module and/or end user.

Figure 2:
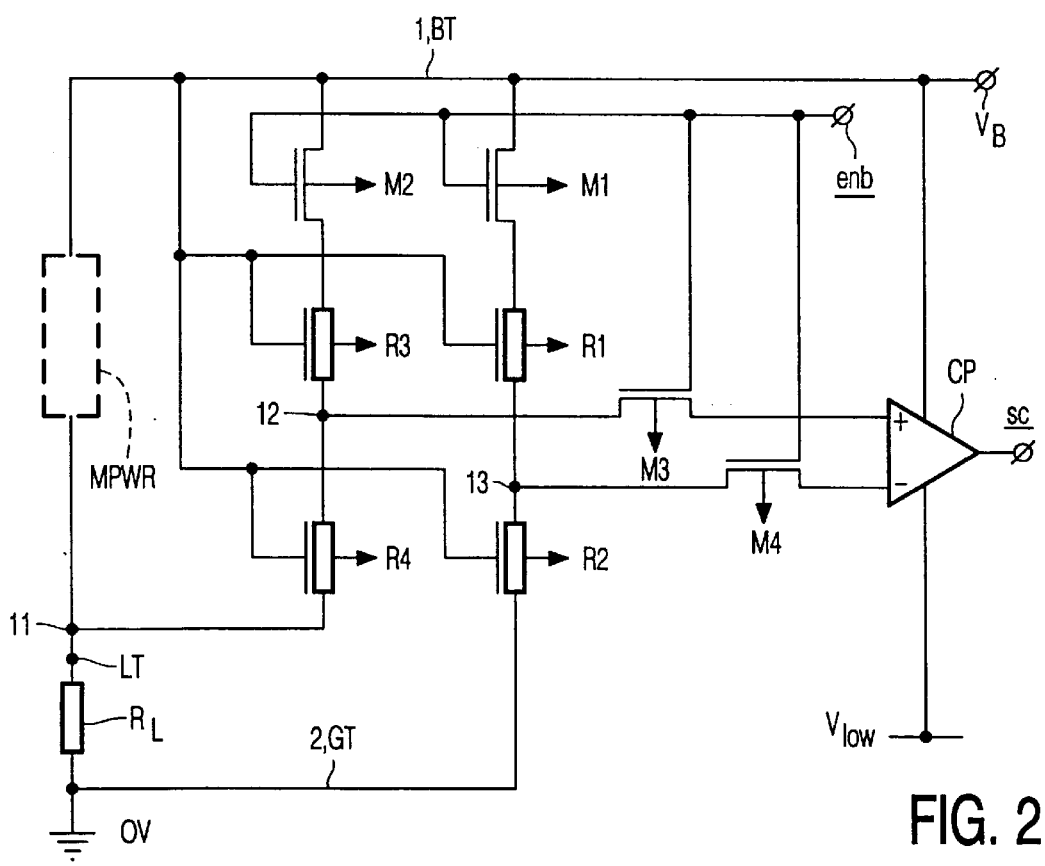
FIG. 2 is a circuit diagram of one example of a short-circuit detector in the circuit of FIG. 1, and including pinch-resistors.

The circuit means illustrated in the particular embodiment of FIG. 2 comprises a matched resistance divider network having pinch resistors R1, R2, R3, R4 in two parallel arms. The first arm comprises first and second resistors R1 and R2 coupled in series between the power supply line 1 and the return line 2 to provide a desired predetermined fraction of Vbg. The second arm comprises third and fourth resistors R3 and R4 coupled in series between the power supply line 1 and a series node 11 of the device MPWR and load $R_L$. A series node 12 between R3 and R4 is coupled to the first input (+) of the comparator CP, whereas the second input (−)

of the comparator CP is coupled to a series node 13 between R1 and R2. The resistors R1 to R4 are pinch resistors having a resistance value which increases with voltage, so as to input a lower percentage of Vbg to the comparator CP at a higher magnitude of Vbg than at a lower magnitude of Vbg, and so to provide a variable detection threshold Vbl(to) for Vbl as a function of Vbg.

This new approach to short circuit detection eliminates the need for any absolute thresholds, such as avalanche diodes, so improving the precision and long term stability of the detector. The resistors R1,R2,R3,R4 can be designed to offer significant J-Fet pinch-off which modifies the divider ratios to achieve reliable and safe detection and protection from short circuit loads across the full range of battery voltages e.g. from 5 to 50 volts.

Figure 3:
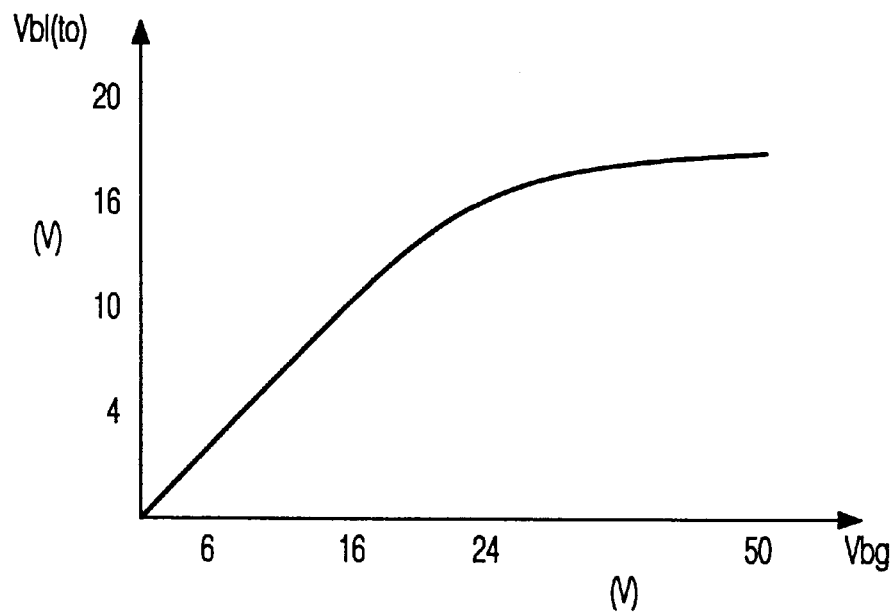
FIG. 3 is a plot illustrating an example of a variable detection threshold Vbl(to) for the supply-to-load voltage Vbl as a function of the supply-to-ground voltage Vbg for the circuit of FIG. 2.

The circuit offers effectively a variable detector threshold Vbl(to) which is a function of Vbg, i.e Vbl(to)=f(Vbg). This is the essence and elegance of the FIG. 2 embodiment of the invention. For example, at low Vbg the effective threshold Vbl(to) may be set to ⅔ of Vbg but at higher Vbg the effective threshold Vbl(to) may increase only to e.g. ⅖ of Vbg. An example of this type of characteristic achievable with the FIG. 2 pinch-resistor network is illustrated in FIG. 3.

Figure 7A:
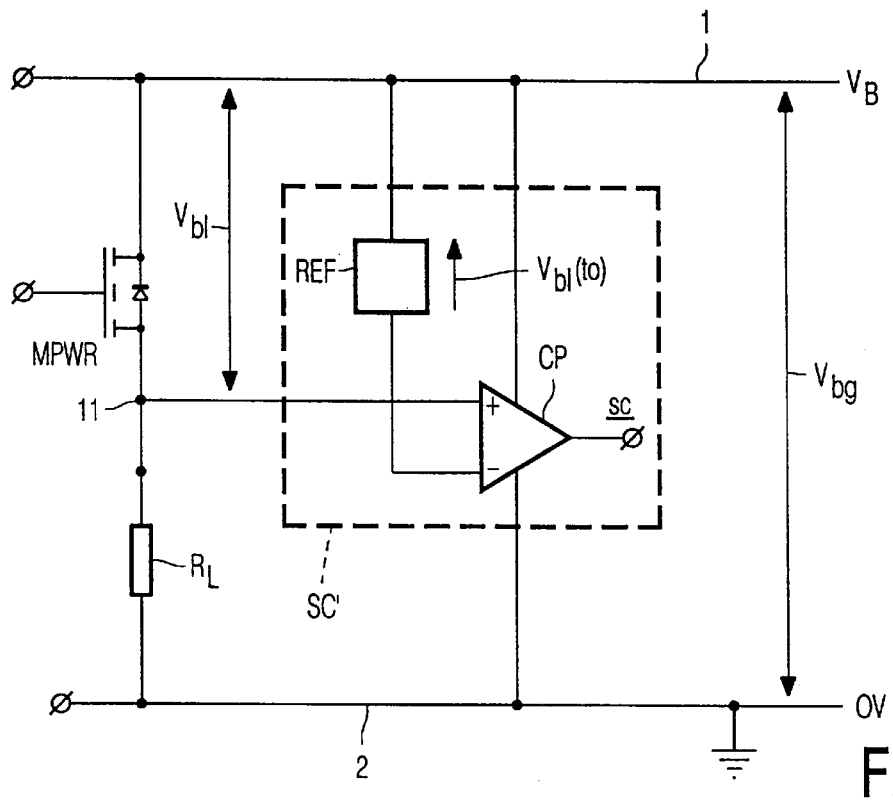
FIGS. 7a and 7b are circuit diagrams of the two main types of circuit which were previously proposed for short-circuit detection and which are not in accordance with the present invention.

Unlike the previous proposal of FIG. 7a, this circuit of the FIG. 2 type in accordance with the invention will indicate a short circuit load even for very low battery voltages Vbg, e.g. 5 volts. Unlike the FIG. 7b circuit, the FIG. 2 type circuit will also allow proper operation at very low battery voltages Vbg with normal loads.

Figure 7B:
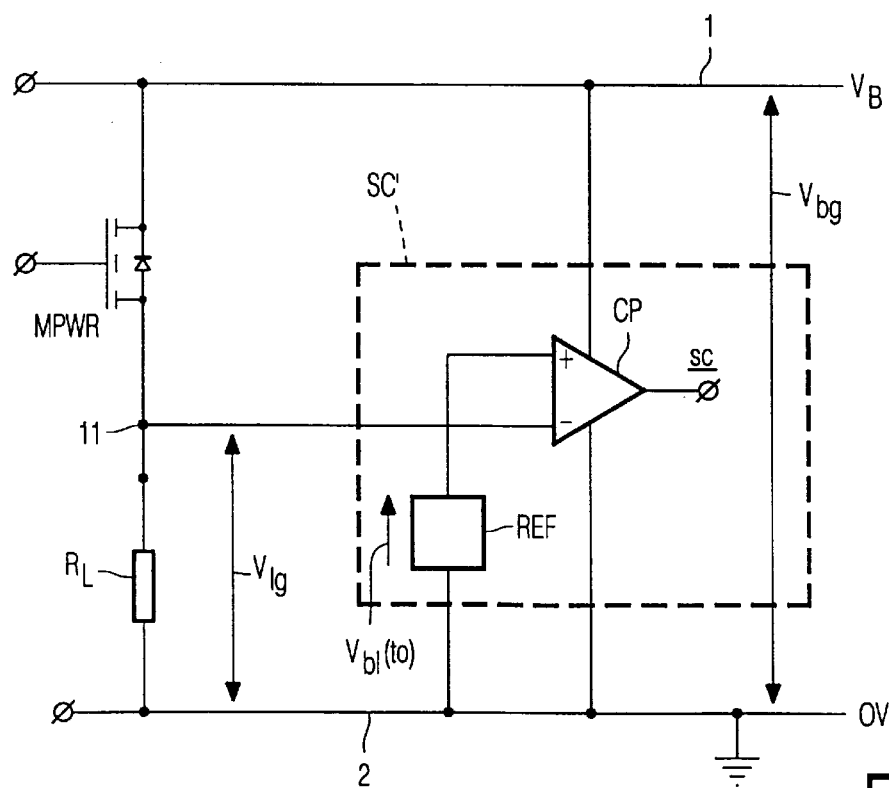

Unlike FIG. 7b, the maximum allowed voltage Vbl across (and power dissipation in) the power device MPWR with this FIG. 2 type circuit in accordance with the invention does not continue to rise steeply at higher Vbg values, instead it is designed to level off at a tolerable safe value. Unlike the previous proposals of FIGS. 7a and 7b, there is no comparison against an independent physically determined voltage, because a simple function of an applied voltage is used instead in this FIG. 2 type circuit in accordance with the invention.

In the preferred circuit embodiment illustrated in FIG. 2, R3 and R4 form a divider which divides Vbl down to levels suitable for comparing with a typical precision (e.g. CMOS) comparator, and R1 and R2 form a similar divider for Vbg. The ratio of R1/(R1+R2) to R3/(R3+R4) determines the initial slope in the Vbl(to) versus Vbg function in FIG. 3.

Figures 6A, 6B:
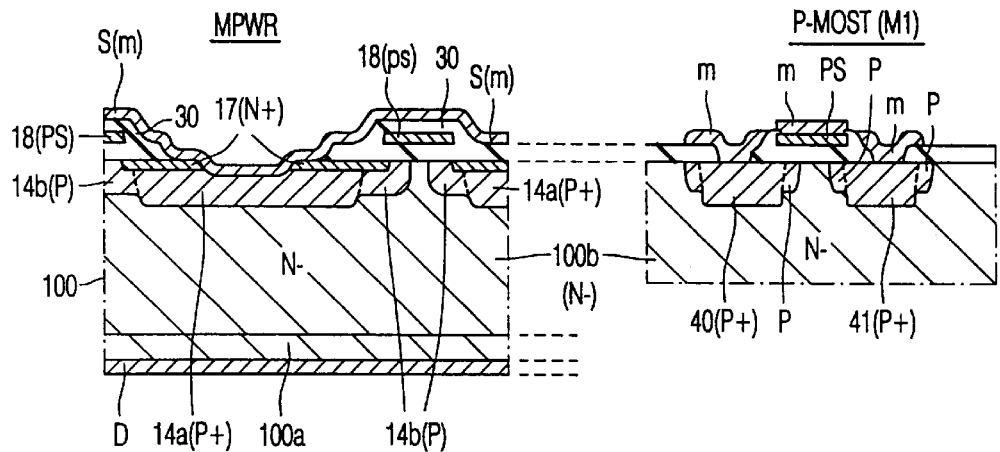
FIGS. 6a to 6f are cross-sectional views of different parts of a semiconductor body of the semiconductor component (power device and short-circuit detector) of the circuit of FIG. 1, illustrating how the semiconductor circuit components of FIG. 1 may be integrated with a power MOSFET or IGBT device using known DMOS technology.
Figures 6C, 6D:
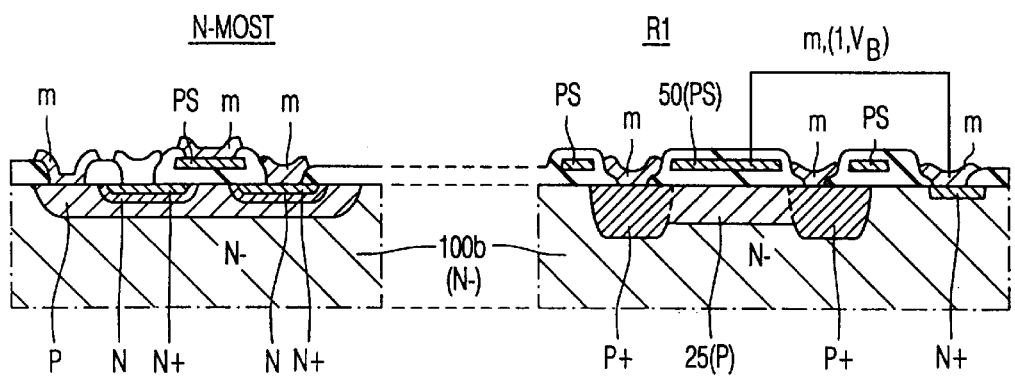

The resistor bodies of R1–R4 may be formed as bulk devices having a relatively low-conductivity resistance region 25 (P) formed in the bulk region 100b (N−) of opposite conductivity type, to give a significant J-Fet pinch-off with respect to the bulk 100b (N−) which is connected to battery, see FIG. 6d. These resistors may further have a top plate 50 (e.g. of polysilicon) connected to supply line 1 to cause a further MOS depletion effect in the resistance region 25. However, this top plate 50 may be connected instead to the most negative resistor terminal if the characteristic is to be linearised.

Isolation MOSTs M1 to M4 prevent current flow in the resistors R1 to R4 when the HSS power device is off, so as to ensure that only extremely small leakage currents are drawn from the battery in the off-state. After turn on of the HSS power device, the MOSTs M1 to M4 are turned on by applying the enable signal enb to their gate electrodes. In the preferred embodiment, M1 and M2 isolate the resistor network R1,R2,R3,R4 from the battery, while M3 and M4 isolate the divider taps from the comparator CP.

The following advantage results from using the above-described Vbl(to) versus Vbg function. Low battery functionality and short circuit detection is maintained, but as battery voltage Vbg increases the allowed power dissipation does not increase so severely. The pinch-off resistance method of achieving this variation offers excellent precision when it most matters, i.e at lower values of the battery voltage Vbg, while further restricting the increase in allowed dissipation at higher values of Vbg.

For almost all real situations a short circuit load will be detected allowing rapid turn-off with minimum heating to the HSS power device, module or wiring.

As with the other detectors, the detector SC should be disabled for some time after turn-on commences so as to allow sufficient time for the HSS to adequately turn-on and attempt to drive the load. In this FIG. 2 circuit example, the output of the comparator CP itself may be held forced inactive during the delay when the enable signal enb is not yet active. The delay circuit and logic can be of known form.

A simpler, modified form of the FIG. 2 type circuit is also possible in accordance with the invention. This simpler circuit still has a resistance divider (e.g. resistors R1 and R2) to give the predetermined function of Vbg as one comparator input (−). However in this simpler, modified form, the other comparator input (+) is directly from the series node 11 of the power semiconductor device MPWR and its load $R_L$, i.e. R4 is zero ohms. In this modification of FIG. 2, R3 & M2 may even be omitted, as well as M3 and M4 at the inputs (−) and (+) of the comparator CP.

Figure 5:
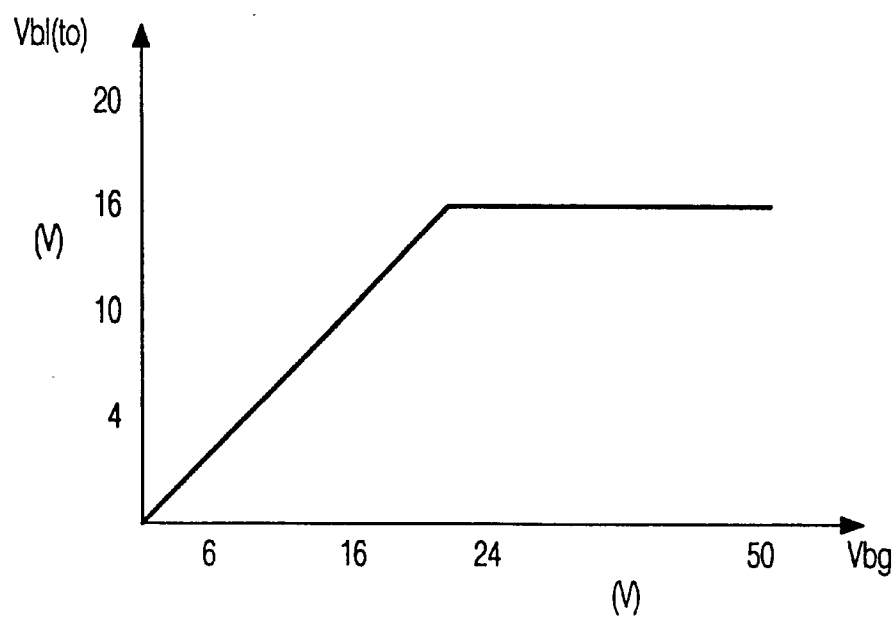
FIG. 5 is a plot illustrating an example of a variable detection threshold Vbl(to) for the supply-to-load voltage Vbl as a function of the supply-to-ground voltage Vbg for the circuit of FIG. 4.

The concept of a detect threshold Vbl(to) as a function of Vbg is not limited to a pinching off style curve as illustrated in FIG. 3. Various other functions may be used which are readily achievable with various circuit configurations, for example linear or curved sections with one or more abrupt or stepped transitions instead of a smooth curve. Thus, for example, a straightline cut-off function as illustrated in FIG. 5 may be used, or an offset straightline function given by, for example, the equation:

$$Vbl(to)=m.Vbg+c$$

where m is the linear gradient and c is an offset.

Figure 4:
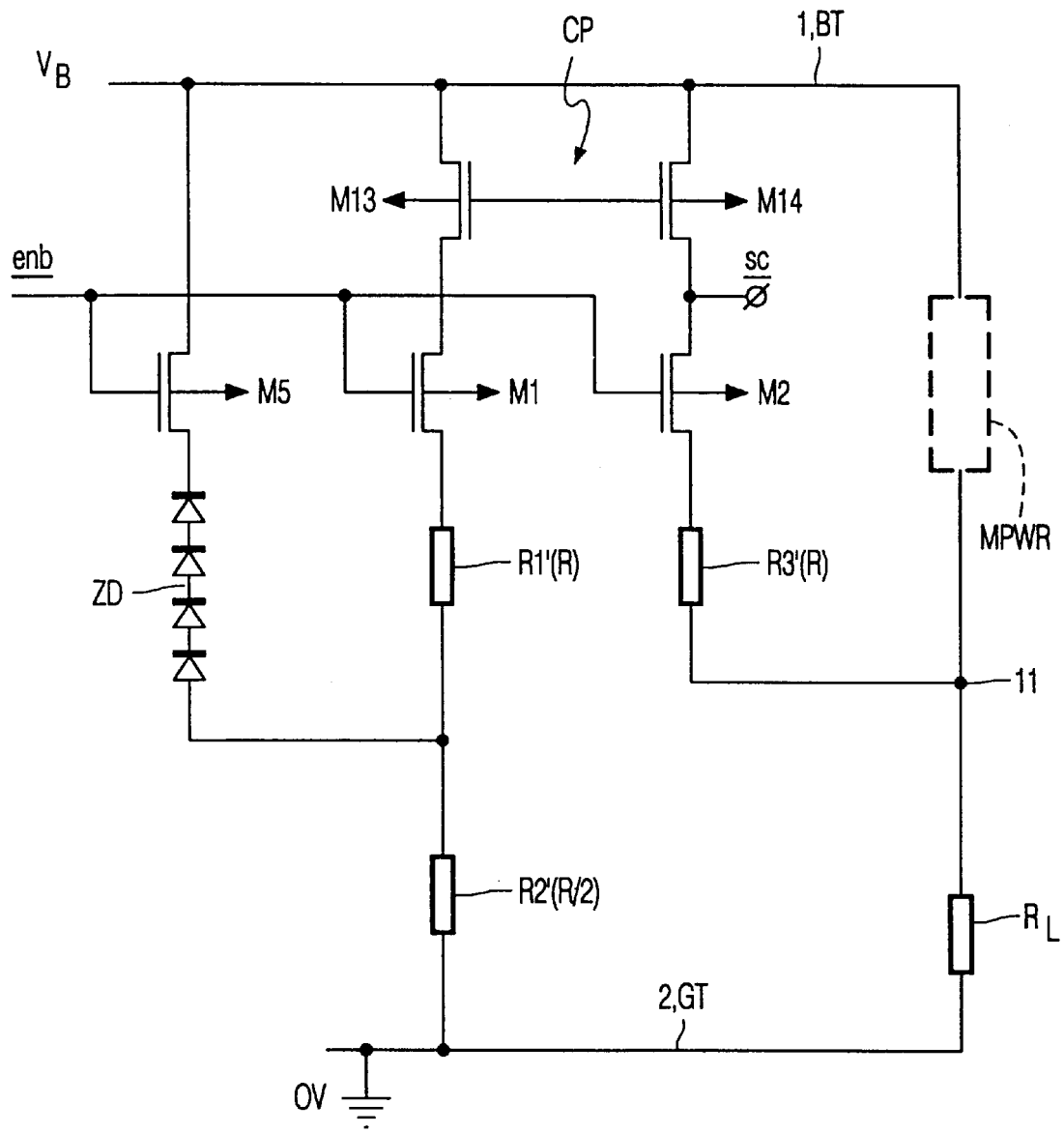
FIG. 4 is a circuit diagram of another example of a short-circuit detector in the circuit of FIG. 1, and including a zener voltage clamp.

The short-circuit detector SC of FIG. 2 and its modified simpler form both employ resistors (R1, R2 etc.) which have a resistance value which increases with voltage so that the predetermined fraction of the Vbg which is input to the comparator CP is higher at lower Vbg than at higher Vbg, and so resulting in the variable detector threshold Vbl(to) illustrated in FIG. 3. FIG. 4 illustrates an alternative short-circuit detector circuit configuration of similar effect, but with non-pinch resistors R1' to R3'. The FIG. 4 circuit has a divided resistance R1',R2' between the supply and ground lines 1 and 2 and a current mirror configuration of MOSTs M13 and M14 forming the comparator CP. The current mirror configuration of MOSTs M13 and M14 has some similarities to the current mirror configuration of transistors T116 and T118 of the FIG. 11 circuit of U.S. Pat. No. 4,929,884. However, in this FIG. 4 circuit in accordance with the present invention the detect threshold Vbl(to) is a strong function of Vbg. Thus, in the FIG. 4 circuit, R1' and R2' are coupled (via M13 and an enable MOST M1) between the supply and ground lines 1 and 2, and M14 is coupled via an enable MOST M2 and a resistor R3' to the series node 11 of the device MPWR and load $R_L$. The resistors R1', R2', R3' in this FIG. 4 circuit act as voltage-to-current converters in two parallel arms of the current-mirror comparator CP. R1' and R3' are matched resistances of value R, whereas R2' is of value R/2. A voltage clamp in the form of a chain of zener diodes ZD is coupled between the supply line 1 and a series node of R1' and R2', via an enable MOST M5. Thus, the predetermined fraction of the supply-to-ground voltage (Vbg) which is input to the comparator CP in FIG. 4 is clamped at higher Vbg, for example as in FIG. 5.

FIGS. 6a to 6f illustrate (by way of cross-sectional views of different parts of a semiconductor body 100) how circuit components which may be used in the circuits of FIGS. 1, 2 and 4 may be integrated with a power MOSFET or IGBT device MPWR using known DMOS technology in a manner similar to that in U.S. Pat. No. 4,929,884.

A specific example is illustrated using conventional DMOS technology to form a power MOSFET or IGBT device of the n-channel enhancement-mode type. In this case, the semiconductor body 100 comprises a relatively lowly-doped n-type silicon epitaxial layer 100b (N−), which forms the drain drift region of the MOSFET or IGBT device, and which is provided on a single-crystal silicon substrate 100a of relatively highly-doped n-type (for the MOSFET) or p-type (for the IGBT). One source cell of the device MPWR is shown in FIG. 6A.

The source cell is of known type and comprises, adjacent one major surface of the semiconductor body region 100b, a p-type transistor-body region 14 which contains a highly-doped n-type (N+) source region 17. In a low-doped (P) part 14b of the region 14 between the regions 17 and 100b there is a conduction channel area under the insulated gate 18 of the power MOSFET or IGBT device. This gate 18 may be a doped polycrystalline silicon layer, designated PS. As shown, the p body region 14 of the cell also has a central highly-doped (P+) subsidiary region 14a which is shorted to the source/cathode electrode S of the power device to inhibit parasitic bipolar action. The source/cathode electrode S and gate electrode G (not shown) are formed by metallisation m provided on top of an insulating layer 30 and making contact to the N+ source region 17 and insulated gate 18, respectively, via appropriate contact holes. The drain/anode electrode D is provided on the other major surface of the semiconductor body 100.

FIG. 6b shows an example of a possible structure for an enhancement mode p-channel MOST, for example the MOSTs M1, M2, M3, etc of FIG. 2, such as may be fabricated using this DMOS technology. The MOST has p conductivity type source and drain regions 40 and 41 (P with P+ contact regions) which are formed by doping an area of the N− region 100b in both the low-doped (P) and highly-doped (P+) p-type doping stages for the power transistor-body parts 14a and 14b. Its gate of polysilicon PS is formed in the same process steps as the gate 18 of the power transistor. Parts of the metallisation pattern m form its source, gate and drain connectors.

FIG. 6c shows an example of a possible structure for an enhancement mode n-channel MOST, for example MOSTs such as may be fabricated using this DMOS technology. Typically, both n-channel and p-channel MOSTs may be used within the comparator CP of FIG. 2. The n-channel MOST is formed in a p-type region P formed in an area of the N− region 100b in the low-doped p-type doping stage for the power transistor-body part 14b. In this p-type region P, n-type source and drain regions (N with N+ contact regions) are formed by doping in an extra low-doped (N) doping stage and the highly-doped (N+) n-type doping stage for the power transistor source region 17. Its gate of polysilicon PS is formed in the same process steps as the gate 18 of the power transistor.

FIG. 6d shows an example of a possible structure for the pinch resistors R1, R2, etc. of the FIG. 2 circuit, such as may be fabricated using this DMOS technology. The pinch resistance region 25 (P) is formed by doping an area of the N− region 100b in the low-doped p-type doping stage for the power transistor-body part 14b. It has contact regions P+ which are formed in the same process steps as the highly-doped power transistor-body part 14a and which are contacted by metal connections m. The pinch resistor also has a top plate 50 which is connected to the power supply line 1, together with the region 100b. The plate 50 is formed by doped polysilicon (PS) on a dielectric film on the resistance region 25 in the same process steps as the power transistor gate 18 on the gate dielectric of the power transistor MPWR. Thus, the semiconductor resistance region 25 can be depleted from above by a MOS-gate effect (a depletion layer from the semiconductor surface under the plate 50) as well as from below by a J-FET effect (a depletion layer at its p-n junction with the region 100b). The plate 50 may also extend as a field-plate over the surface termination of the p-n junction between regions 25 and 100b.

Figures 6E, 6F:
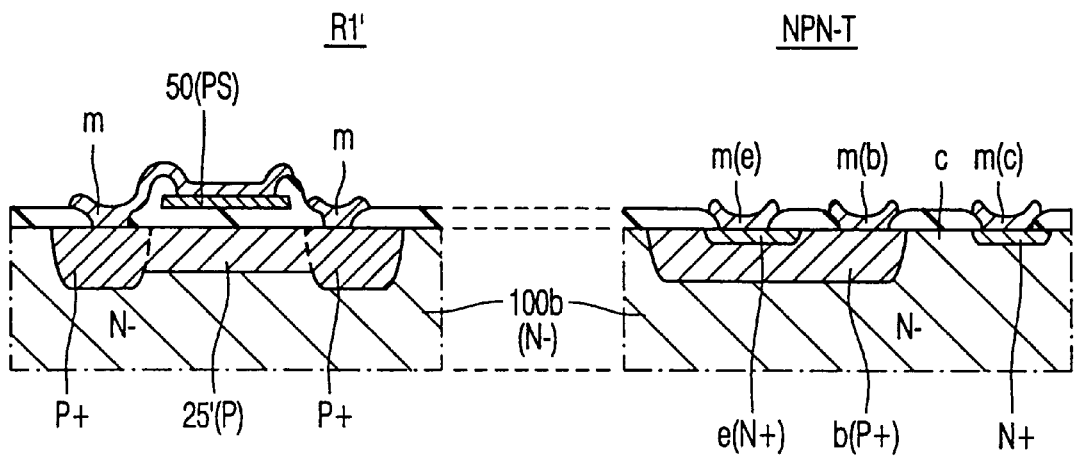

FIG. 6e shows an example of a possible structure for a non-pinch resistors such as R1',R2', etc. of the FIG. 4 circuit, such as may be fabricated using this DMOS technology. In this particular example the non-pinch resistor has the same device structure as a pinch resistor and is formed in the same process steps, but it has a different circuit connection of its plate 50. Thus, in this particular example, the resistance region 25' (P) is formed by doping an area of the N− region 100b in the low-doped p-type doping stage for the power transistor-body part 14b; and contact regions P+ are formed in the same process steps as the highly-doped power transistor-body part 14a and are contacted by metal connections m. A top plate 50 is formed by doped polysilicon (PS) on a dielectric film on the resistance region 25' in the same process steps as the power transistor gate 18 on the gate dielectric of the power transistor MPWR. The plate 50 of this non-pinch resistor acts as an electrostatic screen which is connected to the most negative contact of the resistor by its metal connection m. However a higher doping concentration may be used for the resistance region 25' in order to minimise depletion from its p-n junction with the region 100b. Thus, the resistance region 25' may be formed by doping an area of the N− region 100b in the high-doped p-type (P+) doping stage for the power transistor-body part 14a. The top plate 50 which acts as an electro-static screen may also be included over this P+ resistance region 25'. Furthermore, instead of a doped resistance region 25' in the body 100, the non-pinch resistors R1', R2' etc may be formed in known manner as thin-film polycrystalline silicon resistors on an insulating layer on the body 100.

FIG. 6f shows an example of a possible structure for an n-p-n bipolar transistor T, such as may be fabricated using this DMOS technology to form part of, for example, a temperature sensor in the control circuit LCC. An area of the N-region 100b forms the collector region of the transistor, together with a N+ contact region. A base region B is formed in this area of the N− region 100b in the high-doped P+ p-type doping stage for the power transistor-body part 14a. In this p-type region P+, an n-type emitter region e is formed by doping in the highly-doped N+ n-type doping stage for the power transistor source region 17.

Although FIG. 6a illustrates a planar cellular geometry for the induced channel and the gate 18 along a major surface of the body 100, various known forms of so-called "trench-gate" geometry may be used for MOSFETs and IGBTs, in which the insulated gate 18 is present in a trench in the major surface of the semiconductor body 100, between neighbouring cells in the region 100b. In this case, the channel (induced in transistor-body region 14b) extends vertically along the side walls of the trench. It will be evident that the short-circuit detector circuits of FIGS. 1, 2, and 4 may be integrated with a power semiconductor device MPWR of planar geometry as illustrated in FIG. 6(a) or, for example, of trench-gate geometry.

It will be evident that many more modifications and variations are possible in power device circuits in accordance with the invention. Thus, for example, modified functions of Vbg for the threshold voltage Vlg(to) can be obtained by modifying the circuit elements of the circuits of FIGS. 2 and 4 and their connections. In the FIG. 2 circuit, R1 and R3 may be non-pinch resistors, while retaining R2 and R4 as pinch resistors. Alternatively, all of R1 to R4 may be non-pinch resistors, with a zener diode ZD (or chain of zener diodes, or another form of voltage limiter) coupled across R1 (or across a part of R1, if R1 is made a divided resistance) and/or to the (-) input of the comparator CP of FIG. 2. In the FIG. 4 circuit, R2' may be a pinch resistor, while retaining R1' and R3' as non-pinch resistors. Instead of the flat top cut-off of FIG. 5, the circuit function can provide a sloping or curved top.

FIG. 2 shows the series node 11 (of the power device MPWR and its load $R_L$) coupled to the comparator input by circuit element R4. As described above, the series node 11 may be coupled directly to the comparator input, i.e. omitting R4. In other circuit configurations in accordance with the invention, the series node 11 may be coupled to the comparator input by intermediate circuit means which provide the comparator with a predetermined function of the voltage at the series node 11. Thus, the intermediate circuit means may comprise an amplifier to multiple the magnitude of the voltage at node 11, or an attenuator to divide this voltage, and/or a positive or negative offset may also be applied to the magnitude of the voltage at node 11.

While these examples have been described for a High Side Switch HSS, the same short-circuit detector principle may be used in Low Side Switches (LSSs) in which the power device MPWR is located on the ground side of the load $R_L$. For HSS the threshold voltage could be determined as Vlg(to)=f(Vbg), instead of Vbl(to)=f(Vbg), to achieve a similar result by detecting the voltage Vlg across the load $R_L$ instead of Vbl across the power device MPWR. Similarly for LSS the approach could monitor voltage Vlg across the load $R_L$ or voltage Vbl across the power device MPWR.

Thus, in summary, the present invention provides particularly a power device circuit and/or short-circuit detector having any one or more of the novel features herein described and/or illustrated in the drawings. The short-circuit detector having any of these described and/or illustrated features may be integrated with the power semiconductor device having any of these described and/or illustrated features.

From reading the present disclosure, other modifications and variations will be apparent to persons skilled in the art. Such modifications and variations may involve equivalent features and other features which are already known in the art and which may be used instead of or in addition to features already disclosed herein. Although claims have been formulated in this Application to particular combinations of features, it should be understood that the scope of the disclosure of the present application includes any and every novel feature or any novel combination of features disclosed herein either explicitly or implicitly and any generalisation thereof, whether or not it relates to the same invention as presently claimed in any claim and whether or not it mitigates any or all of the same technical problems as does the present invention. The Applicants hereby give notice that new claims may be formulated to such features and/or combinations of such features during prosecution of the present application or of any further application derived therefrom.

What is claimed is:

1. A power device circuit comprising a power semiconductor device in series with a load between a power supply line and a return line, and a short-circuit detector for determining whether the load is short-circuit, a supply-to-return voltage being applied between the supply and return lines in operation of the circuit, wherein the short-circuit detector examines the distribution of the supply-to-return voltage between the device and the load by comprising a comparator which has a first input coupled to a series node between the device and load and a second input from circuit means coupled between the supply and return lines to provide the second input with a voltage supply signal which is a predetermined function of the supply-to-return voltage, and so comparing the voltage at the series node with the predetermined function of the supply-to-return voltage to provide an output signal indicating whether or not a short-circuit is present.

2. A power device circuit as claimed in claim 1, wherein the predetermined function of the supply-to-return voltage derived by the circuit means varies with the magnitude of the supply-to-return voltage so as to input a lower percentage of the supply-to-return voltage to the comparator at a higher magnitude of the supply-to-return voltage than at a lower magnitude of the supply-to-return voltage.

3. A power device circuit as claimed in claim 2, wherein the circuit means comprises a resistance divider having first and second resistors coupled in series between the power supply line and the return line, a series node between the first and second resistors being coupled to the second input of the comparator to provide the predetermined fraction of the supply-to-return voltage.

4. A power device circuit as claimed in claim 3, wherein the first input of the comparator is taken directly from the series node of the device and load.

5. A power device circuit as claimed in claim 3, wherein the circuit means comprise a resistance divider network having two parallel arms, a first arm comprising the first and second resistors to provide the predetermined fraction of the supply-to-return voltage, and a second arm comprising third and fourth resistors coupled in series between the power supply line and the series node of the device and load, a series node between the third and fourth resistors being coupled to the first input of the comparator.

6. A power device circuit as claimed in claim 3, wherein the resistors are pinch resistors having a resistance value which increases with voltage, whereby a lower voltage fraction is input to the comparator at higher voltage values than at lower voltage values.

7. A power device circuit as claimed in claim 6, wherein each pinch resistor comprises a semiconductor resistance region of one conductivity type which is depleted by a depletion layer from below an overlying plate and by a depletion layer at a p-n junction with a region of the opposite conductivity type.

8. A power device circuit as claimed in claim 2, wherein the short-circuit detector comprises voltage-to-current converters in first and second parallel arms of a current-mirror comparator, the first arm is coupled between the power supply line and the return line and includes a resistance divider of first and second resistors, the second arm is coupled between the power supply line and the series node of the device and load, and a voltage limiter is coupled to a series node between the first and second resistors so that the predetermined function of the supply-to-return voltage which is input to the comparator is limited at higher supply-to-return voltage.

9. A power device circuit as claimed in claim 1, wherein the short-circuit detector is integrated with the power semiconductor device in a semiconductor body.

* * * * *